（12）United States Patent
Xiong et al.

(10) Patent No.: US 11,417,261 B2
(45) Date of Patent: Aug. 16, 2022

(54) GATE DRIVING UNIT CIRCUIT, GATE DRIVING CIRCUIT, DISPLAY DEVICE AND DRIVING METHOD FOR IMPROVING CHARGE RATE

(71) Applicants: Hefei Xinsheng Optoelectronics Technology Co., Ltd., Hefei (CN); BOE TECHNOLOGY GROUP CO., LTD., Beijing (CN)

(72) Inventors: Xiong Xiong, Beijing (CN); Yifeng Zou, Beijing (CN); Yudong Liu, Beijing (CN); Youlu Li, Beijing (CN)

(73) Assignees: Hefei Xinsheng Optoelectronics Technology Group Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 258 days.

(21) Appl. No.: 16/624,102

(22) PCT Filed: Aug. 6, 2019

(86) PCT No.: PCT/CN2019/099506
§ 371 (c)(1),
(2) Date: Dec. 18, 2019

(87) PCT Pub. No.: WO2020/063119
PCT Pub. Date: Apr. 2, 2020

(65) Prior Publication Data
US 2021/0358385 A1    Nov. 18, 2021

(30) Foreign Application Priority Data

Sep. 27, 2018    (CN) .......................... 201811130235.7

(51) Int. Cl.
*G09G 5/00* (2006.01)
*G09G 3/20* (2006.01)
(Continued)

(52) U.S. Cl.
CPC ............. *G09G 3/2092* (2013.01); *G09G 3/20* (2013.01); *G09G 3/3674* (2013.01);
(Continued)

(58) Field of Classification Search
CPC ......... G09G 3/2092; G09G 2310/0286; G09G 2310/061; G09G 2300/0426; G09G 3/20;
(Continued)

(56) References Cited

U.S. PATENT DOCUMENTS 8,698,722 B2    4/2014 Baek et al.
9,424,950 B2    8/2016 Toyotaka et al.
(Continued)

FOREIGN PATENT DOCUMENTS

CN    101364391    2/2009
CN    105185320    12/2015
(Continued)

OTHER PUBLICATIONS

International Search Report and Written Opinion dated Oct. 22, 2019 for PCT Patent Application No. PCT/CN2019/099506.
(Continued)

*Primary Examiner* — Adam J Snyder
(74) *Attorney, Agent, or Firm* — Thomas | Horstemeyer LLP

(57) ABSTRACT

A gate driving unit circuit comprises an input sub-circuit and an output sub-circuit. The input sub-circuit is connected to a first pull-up node, a second pull-up node, and an input terminal, and transmits a signal input from the input terminal to the first pull-up node and the second pull-up node. The output sub-circuit is connected to the first pull-up node, the second pull-up node, a first control terminal, a third control terminal, a first output terminal, and a second output terminal. The output sub-circuit transmits a signal input through the first control terminal to the first output terminal, and
(Continued)

transmits a signal input through the third control terminal to the second output terminal under the control of a potential of the second pull-up node, wherein, an effective voltage of a signal of the first control terminal is greater than that of a signal of the third control terminal.

20 Claims, 7 Drawing Sheets

(51) Int. Cl.
    *G11C 19/28*     (2006.01)
    *G09G 3/36*     (2006.01)

(52) U.S. Cl.
    CPC ........... *G09G 2300/0426* (2013.01); *G09G 2310/0267* (2013.01); *G09G 2310/0286* (2013.01); *G09G 2310/061* (2013.01); *G11C 19/28* (2013.01)

(58) Field of Classification Search
    CPC ......... G09G 3/3674; G09G 2310/0267; G11C 19/28
    See application file for complete search history.

(56) References Cited

U.S. PATENT DOCUMENTS

| | | | |
|---|---|---|---|
| 10,032,416 B2 | 7/2018 | Zhang | |
| 10,256,255 B2 | 4/2019 | Toyotaka et al. | |
| 2007/0104307 A1* | 5/2007 | Kim | G11C 19/28 377/64 |
| 2007/0195053 A1* | 8/2007 | Tobita | G09G 3/3677 345/100 |
| 2009/0040161 A1 | 2/2009 | Baek et al. | |
| 2015/0016585 A1 | 1/2015 | Toyotaka et al. | |
| 2015/0042918 A1* | 2/2015 | Kimura | G09G 3/3677 349/43 |
| 2015/0077319 A1* | 3/2015 | Yao | G09G 3/3677 345/100 |
| 2016/0163743 A1* | 6/2016 | Kimura | G09G 3/3677 257/43 |
| 2016/0365359 A1 | 12/2016 | Toyotaka et al. | |
| 2017/0116924 A1 | 4/2017 | Zhang | |
| 2017/0162161 A1* | 6/2017 | Kimura | G09G 3/3677 |
| 2019/0080780 A1* | 3/2019 | Wang | G09G 3/3677 |
| 2019/0237483 A1 | 8/2019 | Toyotaka et al. | |
| 2020/0118510 A1* | 4/2020 | Kimura | G09G 3/3677 |

FOREIGN PATENT DOCUMENTS

| | | | | |
|---|---|---|---|---|
| CN | 106023943 | | 10/2016 | |
| CN | 106652964 A | * | 5/2017 | ............... G09G 3/20 |
| CN | 107452350 A | | 12/2017 | |
| CN | 108288460 A | | 7/2018 | |
| CN | 108447438 | | 8/2018 | |
| CN | 109064964 A | | 12/2018 | |
| EP | 2023331 | | 2/2009 | |

OTHER PUBLICATIONS

First Office Action for CN Patent Application No. 201811130235.7 dated Nov. 4, 2020.

* cited by examiner

GATE DRIVING UNIT CIRCUIT, GATE DRIVING CIRCUIT, DISPLAY DEVICE AND DRIVING METHOD FOR IMPROVING CHARGE RATE

CROSS REFERENCE TO RELATED APPLICATIONS

The present disclosure is a § 371 national phase application of International Patent Application No. PCT/CN2019/099506 filed on Aug. 6, 2019, which is based upon, claims the benefit of, and claims priority to Chinese Patent Application No. 201811130235.7, titled "GATE DRIVING UNIT CIRCUIT, GATE DRIVING CIRCUIT, DISPLAY DEVICE AND DRIVING METHOD," filed on Sep. 27, 2018, where the contents thereof are incorporated in their entireties herein by reference.

TECHNICAL FIELD

The present disclosure relates to the field of display technology and, in particular, to a gate driving unit circuit, a gate driving circuit and a driving method, and a display device including the gate driving circuit.

BACKGROUND

According to Gate driver on array (GOA) technology, gate driver circuits (also called shift register circuits) are directly fabricated on an array substrate, instead of driving chips made from external chips. The application of GOA can simplify the manufacturing process, reduce product costs, improve the integration of display panels, and make display panels thinner. A circuit integrated on an array substrate using GOA technology is also called a GOA circuit.

As display devices gradually develop to high resolution and high refresh rates, the charging rate requirements for thin film transistors (TFTs) on the array substrate are becoming higher. However, in order to ensure that the TFT on the array substrate has a sufficient charging rate, the transistor device connected to a pull-up node inside the gate drive unit circuit (also known as the shift register unit circuit) will cause display failure due to characteristic drift induced by an excessive voltage, which affects the normal operation of the GOA circuit.

It should be noted that the information disclosed in the Background section above is only used to enhance the understanding of the background of the disclosure, and therefore may include information that does not constitute the prior art known to those of ordinary skill in the art.

SUMMARY

According to an aspect of the present disclosure, there is provided a gate driving unit circuit including an input sub-circuit, an output sub-circuit, and a pull-down node control sub-circuit, wherein the input sub-circuit is connected to a first pull-up node, a second pull-up node, and an input terminal, and the input sub-circuit transmits a signal input from the input terminal to the first pull-up node and the second pull-up node under the control of the signal input from the input terminal. The output sub-circuit is connected to the first pull-up node, the second pull-up node, a first control terminal, a third control terminal, a first output terminal, and a second output terminal. The output sub-circuit transmits a signal input through the third control terminal to the second output terminal under the control of a potential of the first pull-up node, and transmits a signal input through the first control terminal to the first output terminal under the control of a potential of the second pull-up node; the pull-down node control sub-circuit is connected to the first pull-up node, a pull-down node, a first voltage terminal, and a second control terminal, and the pull-down node control sub-circuit is configured to transmit a signal input from the second control terminal to the pull-down node under the control of the signal input from the second control terminal, and is configured to transmit a signal input from the first voltage terminal to the pull-down node under the control of the potential of the first pull-up node; wherein an effective voltage of a signal of the first control terminal is greater than an effective voltage of a signal of the third control terminal, so that the pull-down node control sub-circuit can be turned on under the control of a lower voltage while the first output terminal of the output terminal sub-circuit can output a higher voltage.

According to an embodiment of the present disclosure, the gate driving unit circuit may further include a pull-down node control sub-circuit, wherein the pull-down node control sub-circuit is connected to the first pull-up node, the pull-down node, the first voltage terminal, and the second control terminal. The pull-down node control sub-circuit may transmit the signal input from the second control terminal or the signal input from the first voltage terminal to the pull-down node under the control of the signal input from the second control terminal or the potential of the first pull-up node.

According to an embodiment of the present disclosure, the gate driving unit circuit may further include a pull-down sub-circuit, wherein the pull-down sub-circuit is connected to the pull-down node, the first output terminal, the second output terminal, and the first voltage terminal. The pull-down sub-circuit can transmit the signal input from the first voltage terminal to the first output terminal and the second output terminal under the control of the pull-down node.

According to an embodiment of the present disclosure, the gate driving unit circuit may further include a reset sub-circuit, wherein the reset sub-circuit is connected to a reset control terminal, the first pull-up node, the second pull-up node, the first output terminal, the second output terminal, and the first voltage terminal. The reset sub-circuit may transmit the signal input from the first voltage terminal to the first pull-up node, the second pull-up node, the first output terminal, and the second output terminal under the control of a signal input from the reset control terminal.

According to an embodiment of the present disclosure, the input sub-circuit may include a first input sub-circuit and a second input sub-circuit, and the output sub-circuit may include a first output sub-circuit and a second output sub-circuit. The first input sub-circuit may be connected to the first output sub-circuit via the first pull-up node, and the second input sub-circuit may be connected to the second output sub-circuit via the second pull-up node. The first output sub-circuit can transmit a signal input from the third control terminal to the second output terminal under the control of the potential of the first pull-up node, and the second output sub-circuit can transmit a signal input from the first control terminal to the first output terminal under the control of the potential of the second pull-up node.

According to an embodiment of the present disclosure, the signal input from the first control terminal and the signal input from the third control terminal may have same period and phase, and an effective voltage of the signal input from the first control terminal may be twice an effective voltage of the signal input from the third control terminal.

According to an embodiment of the present disclosure, a pull-up node control sub-circuit may include a first pull-up node control sub-circuit and a second pull-up node control sub-circuit. The first pull-up node control sub-circuit can transmit the signal input from the first voltage terminal to the first pull-up node under the control of a potential of the pull-down node, and the second pull-up node control sub-circuit can transmit the signal input from the first voltage terminal to the second pull-up node under the control of the potential of the pull-down node.

According to an embodiment of the present disclosure, the pull-down node control sub-circuit is connected to the first pull-up node, the pull-down node, the first voltage terminal, and the second control terminal. The pull-down node control sub-circuit is configured to transmit the signal input from the second control terminal to the pull-down node under the control of the signal input from the second control terminal, and is configured to transmit the signal input from the first voltage terminal to the pull-down node under the control of the potential of the first pull-up node.

According to an embodiment of the present disclosure, the reset sub-circuit may include a first reset sub-circuit and a second reset sub-circuit. The first reset sub-circuit can transmit the signal input from the first voltage terminal to the first pull-up node and the second output terminal under the control of the signal input from the reset control terminal, and the second reset sub-circuit can transmit the signal input from the first voltage terminal to the second pull-up node and the first output terminal under the control of the signal input from the reset control terminal.

According to an embodiment of the present disclosure, the first input sub-circuit may include a first transistor, the second input sub-circuit may include a fourteenth transistor, the first output sub-circuit may include a fifteenth transistor and a first capacitor, and the second output sub-circuit may include a third transistor and a second capacitor. A gate and a first electrode of the first transistor may be connected to the input terminal, and a second electrode of the first transistor may be connected to the first pull-up node. A gate and a first electrode of the fourteenth transistor may be connected to the input terminal, and a second electrode of the fourteenth transistor may be connected to the second pull-up node. A gate of the fifteenth transistor may be connected to the first pull-up node, and a first electrode of the fifteenth transistor may be connected to the third control terminal. A first electrode of the first capacitor may be connected to the first pull-up node, and a second electrode of the fifteenth transistor and a second electrode of the first capacitor may be commonly connected to the second output terminal. A gate of the third transistor may be connected to the second pull-up node, and a first electrode of the third transistor may be connected to the first control terminal. A first electrode of the second capacitor may be connected to the second pull-up node, and a second electrode of the third transistor and a second electrode of the second capacitor may be commonly connected to the first output terminal.

According to an embodiment of the present disclosure, the first pull-up node control sub-circuit may include a tenth transistor, and the second pull-up node control sub-circuit may include a twelfth transistor. A gate of the tenth transistor and a gate of the twelfth transistor may be commonly connected to the pull-down node, and a first electrode of the tenth transistor and a first electrode of the twelfth transistor may be commonly connected to the first voltage terminal. A second electrode of the tenth transistor may be connected to the first pull-up node, and a second electrode of the twelfth transistor may be connected to the second pull-up node.

According to an embodiment of the present disclosure, the first pull-down sub-circuit may include an eleventh transistor, and the second pull-down sub-circuit includes a sixteenth transistor. A gate of the eleventh transistor and a gate of the sixteenth transistor may be commonly connected to the pull-down node, and a first electrode of the eleventh transistor and a first electrode of the sixteenth transistor may be commonly connected to the first voltage terminal. A second electrode of the eleventh transistor may be connected to the second output terminal, and a second electrode of the sixteenth transistor may be connected to the first output terminal.

According to an embodiment of the present disclosure, the first reset sub-circuit may include a second transistor and a fourth transistor, and the second reset sub-circuit includes a thirteenth transistor and a seventeenth transistor. A gate of the second transistor, a gate of the fourth transistor, a gate of the thirteenth transistor, and a gate of the seventeenth transistor may be commonly connected to the reset control terminal, and a first electrode of the second transistor, a gate of the fourth transistor, a first electrode of the thirteenth transistor and a first electrode of the seventeenth transistor may be commonly connected to the first voltage terminal. A second electrode of the second transistor may be connected to the first pull-up node, and a second electrode of the fourth transistor is connected to the second output terminal. A second electrode of the thirteenth transistor may be connected to the second pull-up node, and a second electrode of the seventeenth transistor may be connected to the first output terminal.

According to an embodiment of the present disclosure, the pull-down node control sub-circuit may include a ninth transistor, a fifth transistor, an eighth transistor, and a sixth transistor. A gate and a first electrode of the ninth transistor may be connected to the second control terminal, and a second electrode of the ninth transistor may be connected to a gate of the fifth transistor. A first electrode of the fifth transistor may be connected to the second control terminal, and a second electrode of the fifth transistor may be connected to the pull-down node. A gate of the eighth transistor and a gate of the sixth transistor may be commonly connected to the first pull-up node, and a first electrode of the eighth transistor and a first electrode of the sixth transistor may be commonly connected to the first voltage terminal. A second electrode of the eighth transistor may be connected to the gate of the fifth transistor, and a second electrode of the sixth transistor is connected to the pull-down node.

According to another aspect of the present disclosure, there is provided a gate driving circuit including a plurality of cascaded gate driving unit circuits according to the present disclosure, wherein a second output terminal of the gate driving unit circuit of previous stage is connected to an input terminal of the gate driving unit circuit of next stage.

According to an embodiment of the present disclosure, each of the gate driving unit circuits may further include a reset sub-circuit, wherein the reset sub-circuit is connected to the reset control terminal, the first pull-up node, the second pull-up node, the first output terminal, the second output terminal, and the first voltage terminal. The reset sub-circuit may transmit the signal input from the first voltage terminal to the first pull-up node, the second pull-up node, the first output terminal, and the second output terminal under the control of a signal input from the reset control terminal. A first output terminal of the gate driving unit circuit of next stage may be connected to the reset control terminal of the gate driving unit circuit of previous stage.

According to the embodiment of the present disclosure, the signal input from the first control terminal and the signal input from the third control terminal may have same period and phase, and the effective voltage of the signal input from the first control terminal may be twice the effective voltage of the signal input from the third control terminal.

According to another aspect of the present disclosure, there is provided a display device including a gate driving circuit according to the present disclosure.

According to another aspect of the present disclosure, there is provided a method for driving a gate driving unit circuit according to the present disclosure, including an input phase, an output phase, a reset phase, and a pull-down hold phase. In the input phase, the signal applied to the input terminal causes the input sub-circuit to transmit the signal input from the input terminal to the first pull-up node and the second pull-up node.

According to an embodiment of the present disclosure, in the output stage, a signal applied to the first control terminal may cause the output sub-circuit to transmit the signal input from the first control terminal to the first output terminal, and a signal applied to the third control terminal may cause the output sub-circuit to transmit the signal input from the third control terminal to the second output terminal.

According to the embodiment of the present disclosure, in the output stage, a voltage of the first pull-up node may be the sum of a signal applied to the input terminal in the input stage and the signal applied to the third control terminal in the output stage, and a voltage of the second pull-up node may be the sum of the signal applied to the input terminal in the input phase and the signal applied to the first control terminal in the output phase.

According to the embodiment of the present disclosure, the signal input from the first control terminal and the signal input from the third control terminal may have the same period and phase, and the effective voltage of the signal input from the first control terminal may be twice the effective voltage of the signal input from the third control terminal.

Other features and advantages of the disclosure will become apparent from the following detailed description, or may be learned in part through the practice of the disclosure.

It should be understood that the above general description and the following detailed description are merely exemplary and explanatory, and should not limit the present disclosure.

BRIEF DESCRIPTION OF THE DRAWINGS

The drawings, which are incorporated in and constitute a part of this specification, illustrate embodiments consistent with the present disclosure, and together with the description serve to explain the principles of the present disclosure. Understandably, the drawings in the following description are only some embodiments of the present disclosure. For those of ordinary skill in the art, other drawings can be obtained according to these drawings without creative efforts.

DETAILED DESCRIPTION

Figure 1:
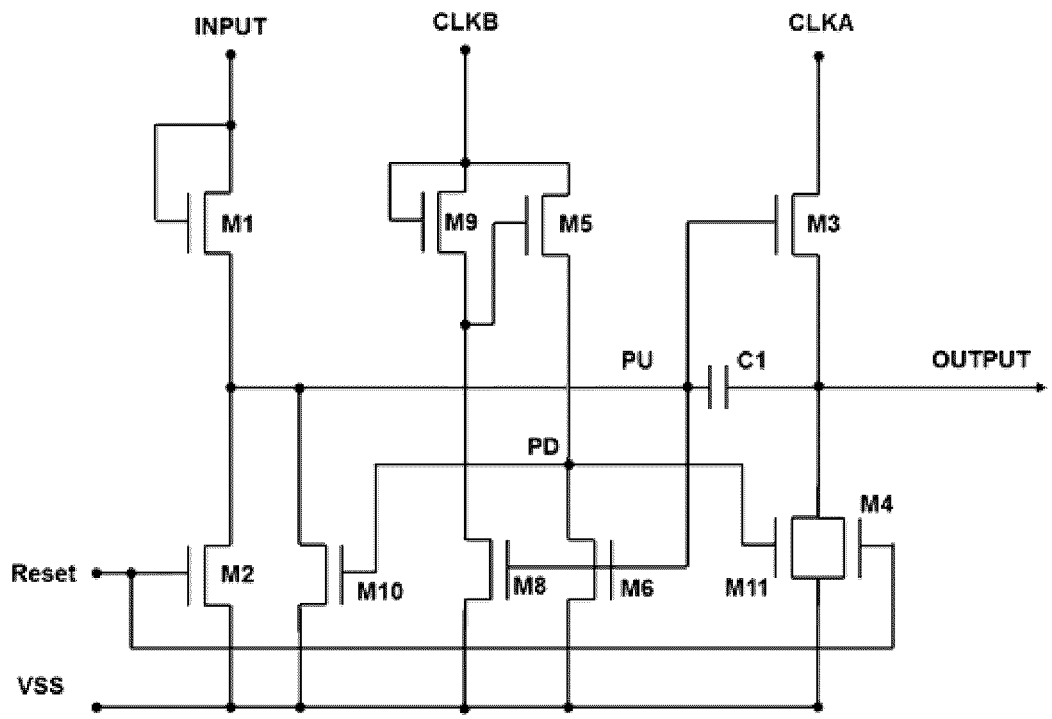
FIG. 1 shows a schematic circuit diagram of a gate driving unit circuit in the related art.

Hereinafter, exemplary embodiments of the present disclosure concept will be described in detail with reference to the accompanying drawings.

However, the disclosed concepts may be illustrated in many different forms and should not be construed as limited to the specific embodiments set forth herein. Furthermore, these embodiments are provided so that this disclosure will be thorough and complete, and will fully convey the scope of the concepts of this disclosure to those skilled in the art.

For clarity, the shape and size of elements may be exaggerated in the drawings and the same reference numbers will be used to refer to the same or similar elements throughout.

Unless otherwise defined, all terms (including technical and scientific terms) used herein have the same meaning as commonly understood by one of ordinary skill in the art to which this disclosure belongs. It should also be understood that unless explicitly defined as such herein, terms such as those defined in a general dictionary should be interpreted to have a meaning consistent with their meaning in the context of the related art and/or this specification, and should not explain them in an informal or overly formal sense.

The transistors used in the embodiments of the present disclosure may be thin film transistors or field effect transistors or other similar devices. Because the source and drain of the transistor used are symmetrical, there is no difference between the source and drain. In addition, transistors can be divided into N-type transistors and P-type transistors.

Figure 2:
FIG. 2 shows a bootstrap effect of a capacitor C1 of the gate driving unit circuit shown in FIG. 1.

FIG. 1 shows a schematic circuit diagram of a gate drive unit circuit in the related art, and FIG. 2 shows an operation process of the gate drive unit circuit shown in FIG. 1 and waveform diagrams of various terminals and nodes.

The gate drive circuit usually includes several gate drive unit circuits. As shown in FIG. 1, in a general gate driving unit circuit, a voltage at a pull-up node PU constitutes the highest voltage of the gate driving unit circuits. Due to the bootstrap effect of a capacitor C1 connected to the pull-up node PU (see the circled part in FIG. 2), the voltage at the pull-up node will reach to 50V-60V. In addition, in order to meet the needs of game products, the resolution and refresh rate of the display panel have been improved, which has led to a shorter charging time for each row of TFTs on the array substrate. Therefore, a voltage of a signal output through an output terminal OUTPUT will be increased, by increasing a voltage of VGH (that is, a high voltage of a signal input through a control terminal CLKA), to realize a sufficient charging rate. Therefore, due to the bootstrap effect of the capacitor C1, the voltage at the pull-up node PU will reach to 70V-80V. This seriously affects the transistors M6 and M8 whose gates are connected to the pull-up node PU, and an excessive voltage causes the drifting of characteristics of the transistors. After a period of time, the transistors M6 and M8 cannot work within a controllable range, which will cause abnormal display.

In view of the above problems in the related art, a concept of the present disclosure is proposed. According to the concept of the present disclosure, a pull-up node is added in addition to the original pull-up node, that is, the gate driving unit circuit according to the present disclosure includes two pull-up nodes. One of the two pull-up nodes is configured to output an output signal with a higher potential that can satisfy a sufficient charge rate, and another pull-up node is configured to provide a control signal with a lower potential for the transistor connected to it.

Figure 3:
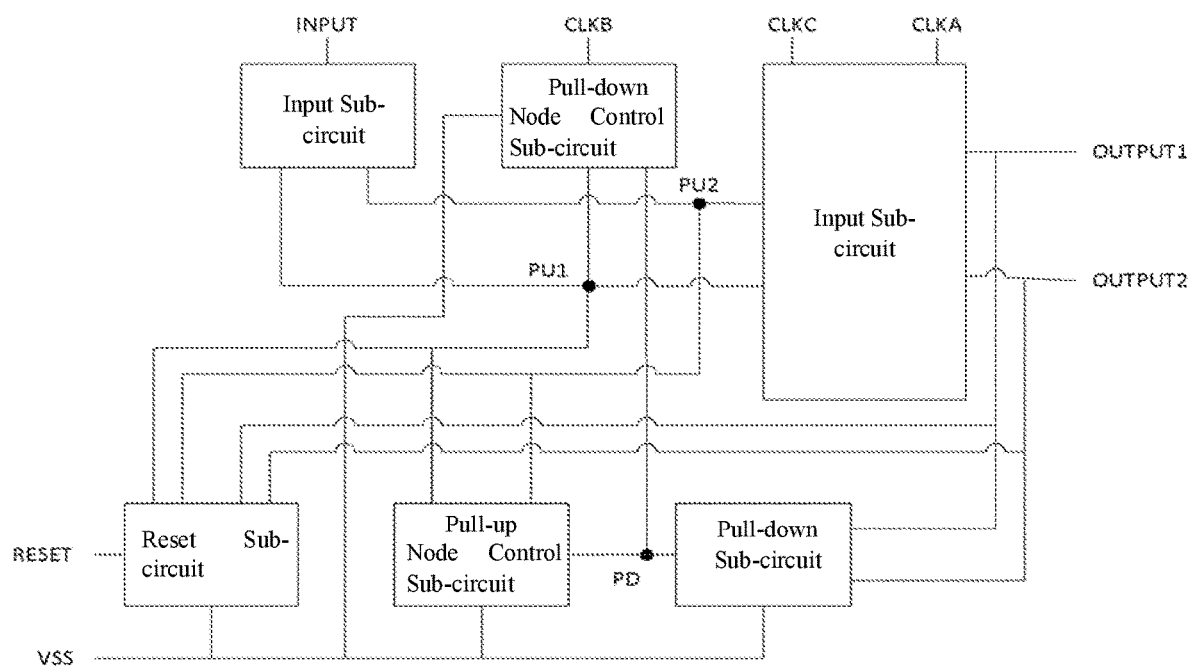
FIG. 3 is a schematic block diagram of a gate driving unit circuit according to an embodiment of the present disclosure.

FIG. 3 is a schematic block diagram of a gate driving unit circuit according to an embodiment of the present disclosure.

As shown in FIG. 3, a gate driving unit circuit according to an embodiment of the present disclosure may include an input sub-circuit 1, an output sub-circuit 2, and a pull-down node control sub-circuit 6. The input sub-circuit 1 is connected to a first pull-up node PU1 and a second pull-up node PU2. The input sub-circuit transmits a signal input from an input terminal INPUT to the first pull-up node PU1 and the second pull-up node PU2 under the control of the signal input from the input terminal INPUT. The output sub-circuit 2 is connected to the first pull-up node PU1, the second pull-up node PU2, a first control terminal CLKA, a third control terminal CLKC, a first output terminal OUTPUT1, and a second output terminal OUTPUT2. The output sub-circuit transmits a signal input through the third control terminal CLKC to the second output terminal OUTPUT2 under the control of a potential of the first pull-up node PU1. The output sub-circuit transmits a signal input through the first control terminal CLKA to the output terminal OUTPUT1 under the control of a potential of the second pull-up node PU2. The pull-down node control sub-circuit 6 is connected to the first pull-up node PU1, a pull-down node PD, a first voltage terminal VSS and a second control terminal CLKB. The pull-down node control sub-circuit 6 transmits a signal input from the second control terminal CLKB to the pull-down node PD under the control of the signal input from the second control terminal CLKB. The pull-down node control sub-circuit 6 is configured to transmit a signal input from the voltage terminal VSS to the pull-down node PD under the control of the potential of the first pull-up node PUL. An effective voltage of the signal of the first control terminal is greater than an effective voltage of the signal of the third control terminal, so that the pull-down node control sub-circuit can be turned on under the control of a lower voltage while the first output terminal of an output sub-circuit can output a higher voltage.

In this exemplary embodiment, the first pull-up node PU1 and the second pull-up node PU2 are not a specific point. The first pull-up node PU1 may be any point with equal potential between the corresponding connection interfaces of the input sub-circuit 1 and the output sub-circuit 2; similarly, the second pull-up node PU2 may be any point with equal potential between the corresponding connection interfaces of the input sub-circuit 1 and the output sub-circuit 2.

In the gate driving unit circuit provided by the present disclosure, as the effective voltage of the signal of the first control terminal is greater than the effective voltage of the signal of the third control terminal, a gate driving signal with a high voltage can be provided to a pixel circuit through the first output terminal OUTPUT1, and a lower breakover voltage can be provided to a part of switching transistors in the pull-down node control sub-circuit through the second output terminal OUTPUT2, thereby avoiding threshold drift of said part of the switching transistors.

As shown in FIG. 3, the gate driving unit circuit may further include a pull-up node control sub-circuit 3. The pull-up node control sub-circuit 3 is connected to the first pull-up node PU1, the second pull-up node PU2, the pull-down node PD, and the first voltage terminal VSS. The pull-up node control sub-circuit transmits a signal input from the first voltage terminal VSS to the first pull-up node PU1 and the second pull-up node PU2 under the control of a potential of the pull-down node PD.

It should be recognized that in the gate driving unit circuit according to the embodiment of the present disclosure, the pull-down node control sub-circuit is connected to only one of the first pull-up node PU1 and the second pull-up node PU2, that is, each of the transistors constituting the pull-down node control sub-circuit is controlled by the potential of only one of the first pull-up node PU1 and the second pull-up node PU2. In order to reduce the drifting of transistor characteristics caused by a high voltage of the transistor connected to the pull-up node, a potential of the pull-up node connected to the gate of the transistor can be set lower, while a potential of the other pull-up node that is not connected to the gate of the transistor can be set higher, for providing a sufficient charge rate.

In the embodiment shown in FIG. 3, the pull-down node control sub-circuit 6 is only connected to the first pull-up node PU1 and is not connected to the second pull-up node PU2. Therefore, the potential of the first pull-up node PU1 can be set lower to reduce the influence on the transistors constituting the pull-down node control sub-circuit, and the potential of the second pull-up node PU2 can be set higher to provide a sufficient charging rate.

As shown in FIG. 3, the gate driving unit circuit may further include a pull-down sub-circuit 4. The pull-down sub-circuit 4 is connected to the pull-down node PD, the first output terminal OUTPUT1, the second output terminal OUTPUT2, and the first voltage terminal VSS. The pull-down sub-circuit transmits the signal input from the first voltage terminal VSS to the first output terminal OUTPUT1 and the second output terminal OUTPUT2 under the control of the pull-down node PD.

As shown in FIG. 3, the gate driving unit circuit may further include a reset sub-circuit 5. The reset sub-circuit 5 is connected to a reset control terminal RESET, the first pull-up node PU1, the second pull-up node PU2, the first output terminal OUTPUT1, the second output terminal OUTPUT2, and the first voltage terminal VSS. The reset sub-circuit transmits the signal input from the first voltage terminal VSS to the first pull-up node PU1, the second pull-up node PU2, the first output terminal OUTPUT1 and the second output terminal OUTPUT2 under the control of a signal input from the reset control terminal RESET.

When the gate drive unit circuits are cascaded, an output signal of the gate drive unit circuit of previous stage can be used as an input signal of the gate drive unit circuit of next stage, and the output signal of the gate drive unit circuit of next stage can be used as a reset signal of the gate drive unit circuit of previous stage. The cascade manner of the gate driving unit circuit according to the embodiment of the present disclosure will be described later in detail.

Figure 4:
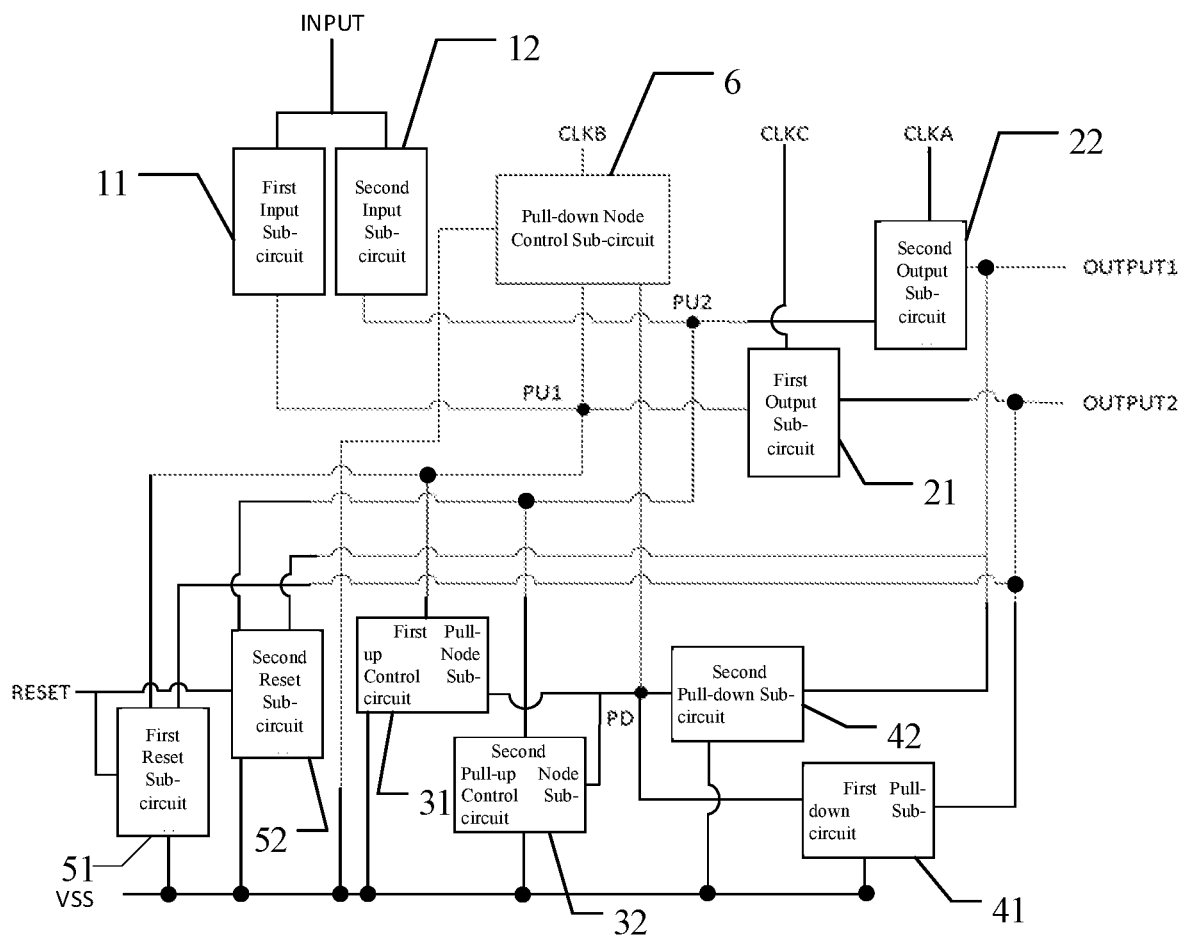
FIG. 4 is a schematic block diagram of a gate driving unit circuit according to an embodiment of the present disclosure.
Figure 5:
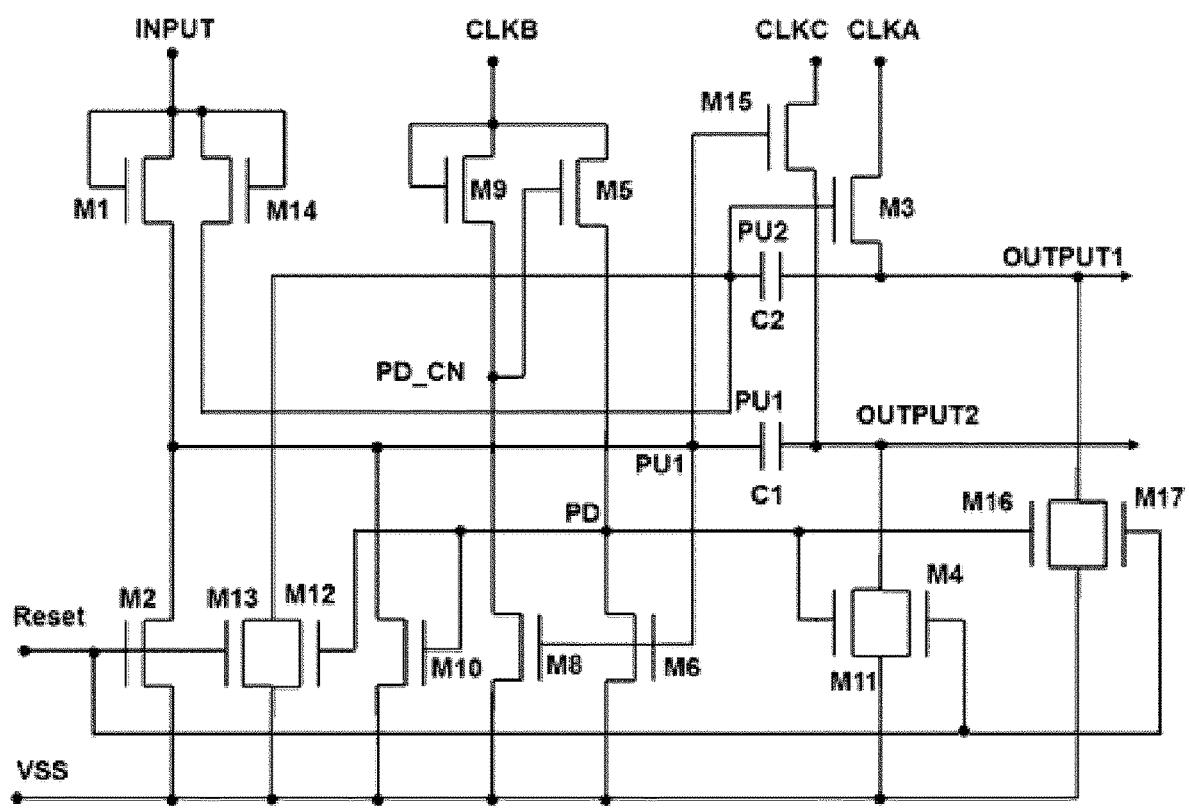
FIG. 5 is a schematic circuit diagram of a gate driving unit circuit according to an embodiment of the present disclosure.

FIG. 4 is a schematic block diagram of a gate driving unit circuit according to an embodiment of the present disclosure; FIG. 5 is a schematic circuit diagram of a gate driving unit circuit according to an embodiment of the present disclosure.

Referring to FIG. 3 and FIG. 4, the input sub-circuit of the gate driving unit circuit according to an embodiment of the present disclosure may include a first input sub-circuit 11 and a second input sub-circuit 12, and an output sub-circuit may include a first output sub-circuit 21 and a second output sub-circuit 22. The first input sub-circuit 11 may be connected to the first output sub-circuit 21 via the first pull-up node PU1, and the second input sub-circuit 12 may be connected to the second output sub-circuit 22 via the second pull-up node PU2. The first output sub-circuit 21 may transmit the signal input from the third control terminal CLKC to the second output terminal OUTPUT2 under the control of the potential of the first pull-up node PU1, and the second output sub-circuit 22 may transmit the signal input from the first control terminal CLKA to the first output terminal OUTPUT1 under the control of the potential of the second pull-up node PU2.

As shown in FIG. 5, the first input sub-circuit 11 may include a first transistor M1, the second input sub-circuit 12 may include a fourteenth transistor M14, and the first output sub-circuit 21 may include a fifteenth transistor M15 and a first capacitor C1, and the second output sub-circuit 22 includes a third transistor M3 and a second capacitor C2. A gate and a first electrode of the first transistor M1 are connected to the input terminal INPUT, and a second electrode of the first transistor M1 is connected to the first pull-up node PU1. A gate and a first electrode of the fourteenth transistor M14 are connected to the input terminal INPUT, and a second electrode of the fourteenth transistor M14 is connected to the second pull-up node PU2. A gate of the fifteenth transistor M15 is connected to the first pull-up node PU1, and a first electrode of the fifteenth transistor M15 is connected to the third control terminal CLKC. A first electrode of the first capacitor C1 is connected to the first pull-up node PU1, and a second electrode of the fifteenth transistor and a second electrode of the first capacitor C1 are commonly connected to the second output terminal OUTPUT2. A gate of the third transistor M3 is connected to the second pull-up node PU2, and a first electrode of the third transistor M3 is connected to the first control terminal CLKA. A first electrode of the second capacitor C2 is connected to the second pull-up node PU2, and a second electrode of the third transistor and a second electrode of the second capacitor C2 are commonly connected to the first output terminal OUTPUT1.

Figure 6:
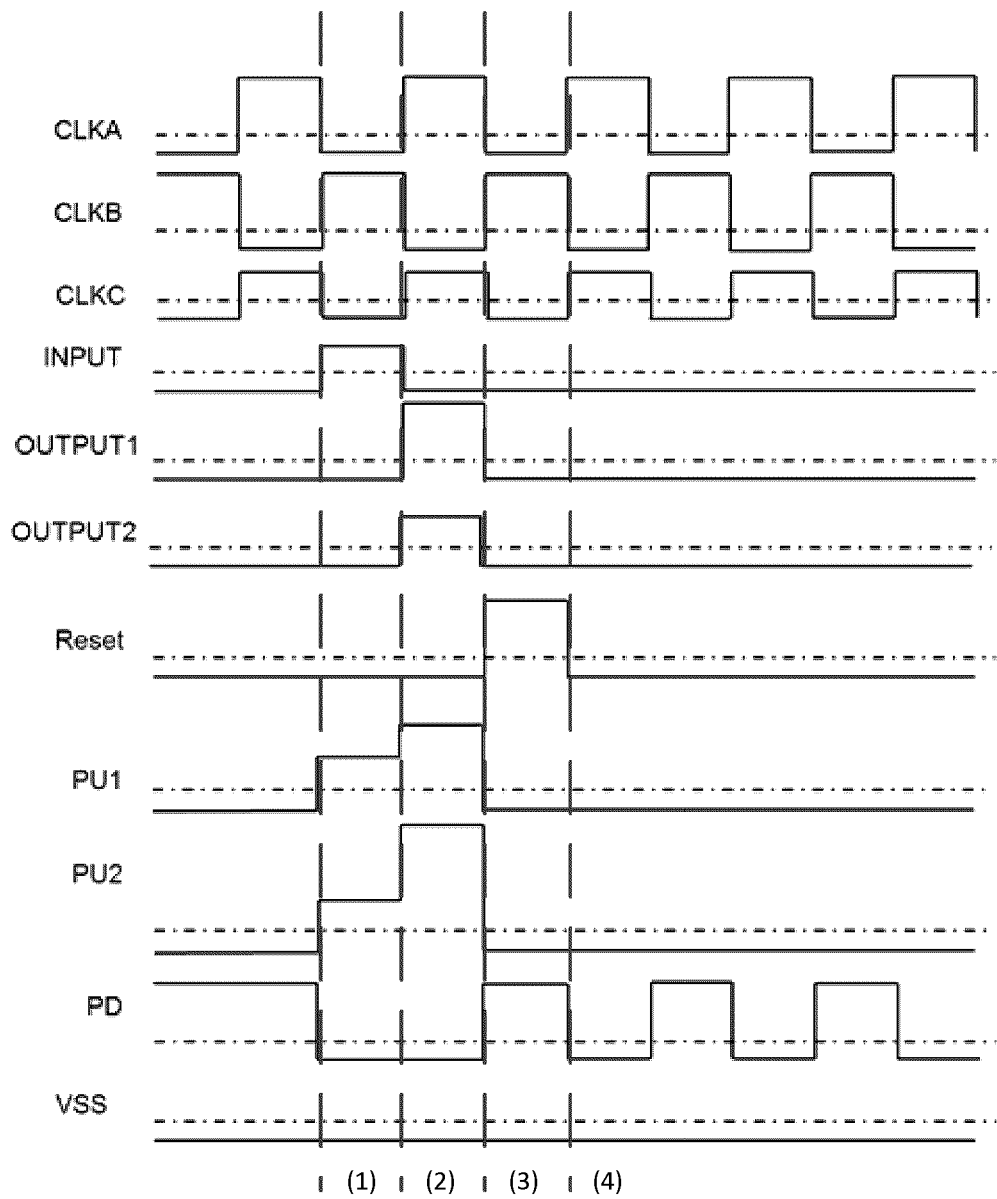
FIG. 6 shows an operation process of the gate driving unit circuit shown in FIG. 5 and waveform diagrams of various terminals and nodes.

FIG. 6 shows an operation process of the gate driving unit circuit shown in FIG. 5 and waveform diagrams of various terminals and nodes.

Referring to FIG. 6, according to an embodiment of the present disclosure, the signal input from the first control terminal CLKA and the signal input from the third control terminal CLKC have same period and phase, and an effective voltage of the signal input from the first control terminal CLKA may be twice an effective voltage of the signal input from the third control terminal CLKC.

In the input stage (1), a signal applied to the input terminal INPUT causes the input sub-circuit to transmit the signal input from the input terminal INPUT to the first pull-up node PU1 and the second pull-up node PU2. In this case, the potentials of the first pull-up node PU1 and the second pull-up node PU2 may be the potential of the signal input from the input terminal INPUT.

In the output stage (2), a signal applied to the first control terminal CLKA causes the output sub-circuit to transmit the signal input from the first control terminal CLKA to the first output terminal OUTPUT1, and the signal applied to the third control terminal CLKC causes the output sub-circuit transmits the signal input from the third control terminal CLKC to the second output terminal OUTPUT2. Due to the bootstrap effect of the second capacitor C2, the potential of the second pull-up node PU2 reaches to the sum of the voltages of the signal input from the input terminal INPUT in the input stage (1) and the signal input from the first control terminal CLKA in the output stage (2), and due to the bootstrap effect of the first capacitor C1, the potential of the first pull-up node PU1 reaches to the sum of the voltages of the signal input from the input terminal INPUT in the input phase (1) and the signal input from the third control terminal CLKC in the output phase (2).

According to the embodiment of the present disclosure, the effective voltage of the signal input from the first control terminal CLKA may be twice the effective voltage of the signal input from the third control terminal CLKC. Therefore, in the output stage (2), the potential of the first pull-up node PU1 can be lower than the potential of the second pull-up node PU2, as shown in FIG. 6.

It should be recognized that the signal applied to the first control terminal CLKA is set to be larger, so that a signal sufficiently satisfying the charging rate can be output from the first output terminal OUTPUT1. In addition, the signal applied to the second control terminal CLKB is set to be smaller, so that the potential of the first pull-up node PU1 can be at a relatively low voltage, thereby reducing the drifting of characteristics of the transistor connected to the first pull-up node PU1 due to an excessive voltage.

According to an embodiment of the present disclosure, the signal applied to the first control terminal CLKA may be a second voltage VGH, and the signal applied to the third control terminal CLKC may be half of the second voltage VGH, that is, VGH/2. In this way, a voltage of the signal output through the first output terminal OUTPUT1 can be the second voltage VGH, and a voltage of the signal output through the first output terminal OUTPUT2 can be VGH/2.

When the gate drive unit circuits are cascaded, the second output terminal OUTPUT2 of the gate drive unit circuit of previous stage can be connected to the input terminal INPUT of the gate drive unit circuit of next stage, that is, the voltage of the signal input from the input terminal INPUT can be VGH/2. In this case, the potential of the first pull-up node PU1 can reach to (VGH/2+VGH/2)=VGH, and the potential of the second pull-up node PU2 can reach to (VGH/2+VGH)=3VGH/2. According to the embodiment of the present disclosure, a high potential of the second pull-up node PU2 does not affect the transistor device because the second pull-up node PU2 is not connected to the gate of any transistor.

On the other hand, when the gate drive unit circuits are cascaded, the first output terminal OUTPUT1 of the gate drive unit circuit of next stage can be connected to the reset control terminal RESET of the gate drive unit circuit of previous stage. The voltage of the signal output through the first output terminal OUTPUT1 may be the second voltage VGH, so the voltage of the signal input from the reset control terminal RESET may be the second voltage VGH, referring to FIG. 6.

Returning to FIG. 3 and FIG. 4, the pull-up node control sub-circuit of the gate driving unit circuit according to the embodiment of the present disclosure may include a first pull-up node control sub-circuit 31 and a second pull-up node control sub-circuit 32. The first pull-up node control sub-circuit 31 may transmit the signal input from the first voltage terminal VSS to the first pull-up node PU1 under the control of the potential of the pull-down node PD, and the second pull-up node control sub-circuit 32 may transmit the signal input from the first voltage terminal VSS to the second pull-up node PU2 under the control of the potential of the pull-down node PD.

As shown in FIG. 5, the first pull-up node control sub-circuit 31 may include a tenth transistor M10, and the second pull-up node control sub-circuit 32 may include a twelfth transistor M12. A gate of the tenth transistor M10 and a gate of the twelfth transistor M12 may be commonly connected to the pull-down node PD, and a first electrode of the tenth transistor M10 and a first electrode of the twelfth transistor M12 may be commonly connected to the first voltage terminal VSS. A second electrode of the tenth transistor M10 may be connected to the first pull-up node PU1, and a second electrode of the twelfth transistor M12 may be connected to the second pull-up node PU2.

As shown in FIG. 4, the pull-down sub-circuit of the gate driving unit circuit according to an embodiment of the present disclosure may include a first pull-down sub-circuit 41 and a second pull-down sub-circuit 42. The first pull-down sub-circuit 41 may transmit the signal input from the first voltage terminal VSS to the second output terminal OUTPUT2 under the control of the potential of the pull-down node PD, and the second pull-down sub-circuit 42 may transmit the signal input from the first voltage terminal VSS is transmitted to the first output terminal OUTPUT1 under the control of the potential of the pull-down node PD.

As shown in FIG. 5, the first pull-down sub-circuit 41 may include an eleventh transistor M11, and the second pull-down sub-circuit 42 includes a sixteenth transistor M16. A gate of the eleventh transistor M11 and a gate of the sixteenth transistor M16 may be commonly connected to the pull-down node PD, and a first electrode of the eleventh transistor M11 and a first electrode of the sixteenth transistor M16 may be commonly connected to the first voltage terminal VSS. A second electrode of the eleventh transistor M11 may be connected to the second output terminal OUTPUT2, and a second electrode of the sixteenth transistor M16 may be connected to the first output terminal OUTPUT1.

As shown in FIG. 4, the reset sub-circuit of the gate driving unit circuit according to an embodiment of the present disclosure may include a first reset sub-circuit 51 and a second reset sub-circuit 52. The first reset sub-circuit 51 can transmit the signal input from the first voltage terminal VSS to the first pull-up node PU1 and the second output terminal OUTPUT2 under the control of the signal input from the reset control terminal RESET, and the second reset sub-circuit 52 can transmit the signal input from the first voltage terminal VSS to the second pull-up node PU2 and the first output terminal OUTPUT1 under the control of the signal input from the reset control terminal RESET.

As shown in FIG. 5, the first reset sub-circuit 51 may include a second transistor M2 and a fourth transistor M4, and the second reset sub-circuit 52 includes a thirteenth transistor M13 and a seventeenth transistor M17. A gate of the second transistor M2, a gate of the fourth transistor M4, a gate of the thirteenth transistor M13, and a gate of the seventeenth transistor M17 may be commonly connected to the reset control terminal RESET, and a first electrode of the second transistor M2, a first electrode of the fourth transistor M4, a first electrode of the thirteenth transistor M13, and a first electrode of the seventeenth transistor M17 may be commonly connected to the first voltage terminal VSS. A second electrode of the second transistor M2 can be connected to the first pull-up node PU1, a second electrode of the fourth transistor M4 can be connected to the second output terminal OUTPUT2, a second electrode of the thir-teenth transistor M13 can be connected to the second pull-up node PU2, and a second electrode of the seventeenth transistor M17 can be connected to the first output terminal OUTPUT1.

As shown in FIG. 5, the pull-down node control sub-circuit of the gate driving unit circuit according to an embodiment of the present disclosure may include a ninth transistor M9, a fifth transistor M5, an eighth transistor M8, and a sixth transistor M6. A gate and a first electrode of the ninth transistor M9 may be connected to the second control terminal CLKB, and a second electrode of the ninth transistor M9 may be connected to a gate of the fifth transistor M5. A first electrode of the fifth transistor M5 may be connected to the second control terminal CLKB, and a second electrode of the fifth transistor may be connected to the pull-down node PD. A gate of the eighth transistor M8 and a gate of the sixth transistor M6 may be commonly connected to the first pull-up node PU1, and a first electrode of the eighth transistor M8 and a first electrode of the sixth transistor M6 may be commonly connected to the first voltage terminal VSS. A second electrode of the eighth transistor M8 may be connected to the gate of the fifth transistor M5, and a second electrode of the sixth transistor M6 may be connected to the pull-down node PD.

Figure 7:
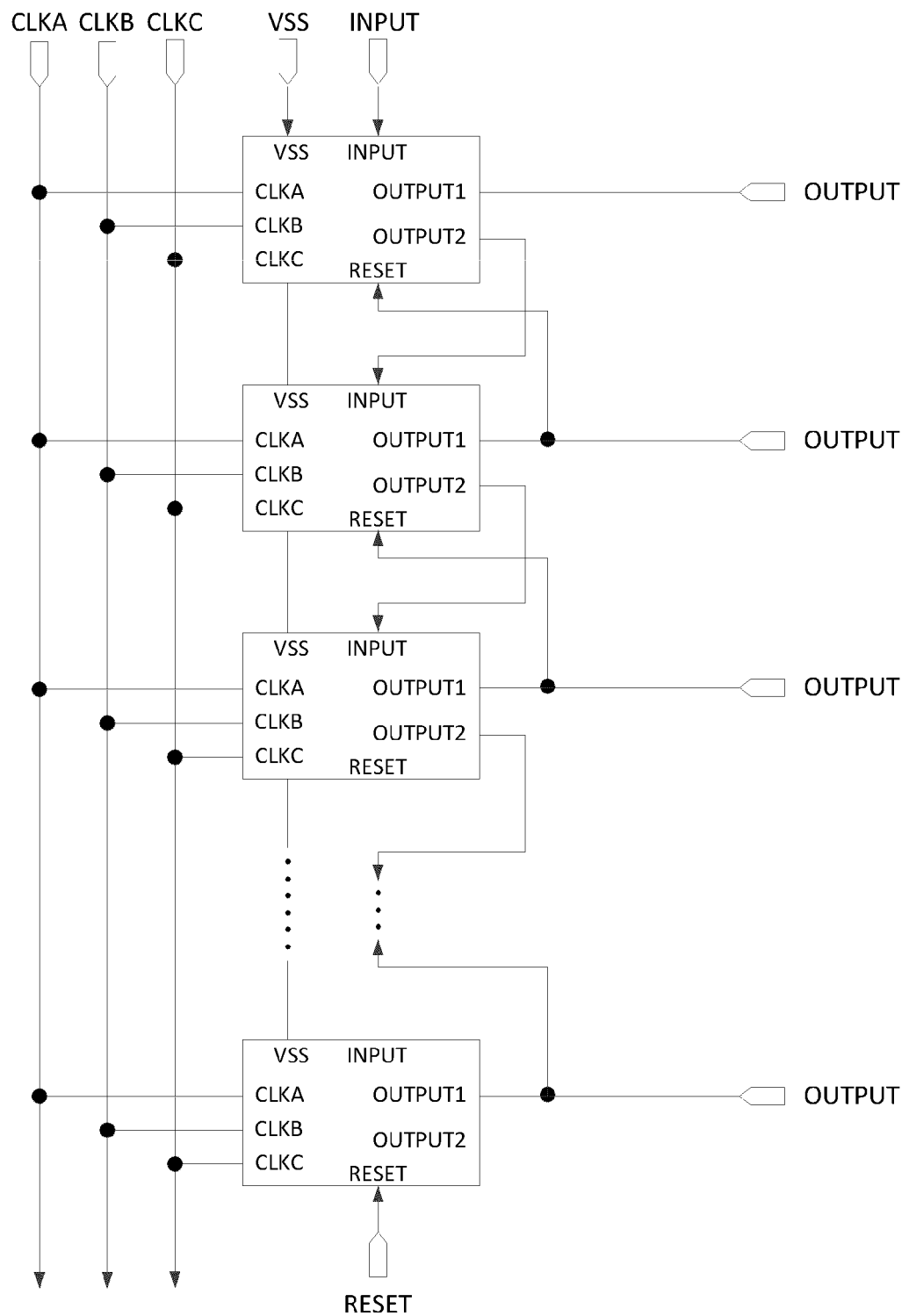
FIG. 7 is a schematic diagram of a gate driving circuit according to an embodiment of the present disclosure.
Figure 8:
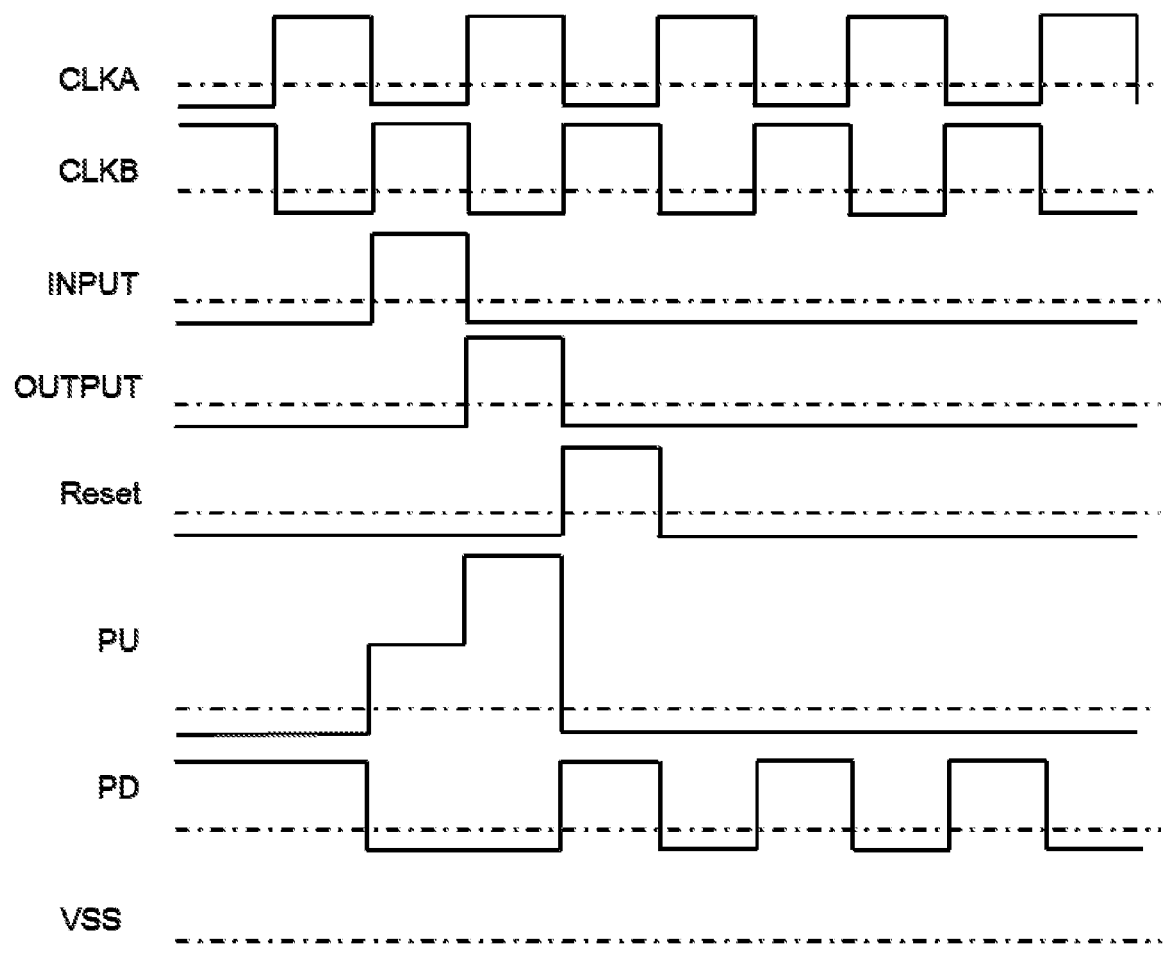
FIG. 8 shows an operation process of the gate driving unit circuit shown in FIG. 1, and waveform diagrams of various terminals and nodes.

FIG. 7 is a schematic diagram of a gate driving circuit according to an embodiment of the present disclosure.

According to an embodiment of the present disclosure, there is provided a gate driving circuit including a plurality of cascaded gate driving unit circuits, and the gate driving unit circuit may be the gate driving unit circuit according to various embodiments of the present disclosure. The second output terminal OUTPUT2 of the gate drive unit circuit of previous stage can be connected to the input terminal INPUT of the gate drive unit circuit of next stage. In addition, the first output terminal OUTPUT1 of the gate drive unit circuit of next stage can be connected to the reset control terminal RESET of the gate drive unit circuit of previous stage.

As shown in FIG. 7, in the gate driving circuit according to the embodiment of the present disclosure, each of the gate driving unit circuits includes the reset control terminal RESET and the input terminal INPUT. Except for a first-stage gate driving unit circuit, the input terminal INPUT of each stage of the gate driving unit circuit is connected to the second output terminal OUTPUT2 of the adjacent previous-stage gate driving unit circuit. Except for a last-stage gate drive unit circuit, the reset control terminal RESET of each stage of the gate drive unit circuit is connected to the first output terminal OUTPUT1 of the gate drive unit circuit of its next stage. In addition, the first output terminal OUTPUT1 of each stage of the gate driving unit circuit is used to provide an output signal OUTPUT of the gate driving circuit.

According to an embodiment of the present disclosure, there is provided a display device including the gate driving circuit according to various embodiments of the present disclosure.

According to an embodiment of the present disclosure, a method for driving a gate driving unit circuit is provided. The gate driving unit circuit may be the gate driving unit circuit according to various embodiments of the present disclosure. The method may include an input stage, an output phase, a reset phase, and a pull-down hold phase. In the input stage, the signal applied to the input terminal INPUT causes the input sub-circuit to transmit the signal input from the input terminal INPUT to the first pull-up node PU1 and the second pull-up node PU2. In the output stage, the signal applied to the first control terminal CLKA causes the output sub-circuit to transmit the signal input from the first control terminal CLKA to the first output terminal OUTPUT1, and the signal applied to the third control terminal CLKC causes the output sub-circuit to transmits the first the signal input from the third control terminals CLKC to the second output terminal OUTPUT2.

The transistors used in the embodiments of the present disclosure may be thin film transistors or field effect transistors or other similar devices. In addition, the transistor may be an N-type transistor or a P-type transistor.

The gate driving circuit according to the present disclosure can be applied to various display devices, such as, a liquid crystal display, a large-sized splicing screen, and other display devices based on various technologies including amorphous silicon (a-Si), oxide, low temperature polysilicon (LTPS), and high temperature polysilicon (HTPS).

Those skilled in the art will readily think of other embodiments of the present disclosure after considering the specification and practicing the invention disclosed herein. This application is intended to cover any variations, uses, or adaptations of this disclosure that conform to the general principles of this disclosure and include the common general knowledge or conventional technical means in the technical field not disclosed in this disclosure. It is intended that the specification and examples be considered as exemplary only, with a true scope and spirit of the disclosure being indicated by the following claims.

What is claimed is:

1. A gate driving unit circuit, being the gate driving unit circuit at a stage of a gate driving circuit comprising a plurality of cascaded gate driving unit circuits, and comprising an input sub-circuit, an output sub-circuit, and a pull-down node control sub-circuit, wherein:
   the input sub-circuit is connected to a first pull-up node, a second pull-up node and an input terminal, and the input sub-circuit is configured to transmit a signal input from the input terminal to the first pull-up node and the second pull-up node;
   the output sub-circuit is connected to the first pull-up node, the second pull-up node, a first control terminal, a third control terminal, a first output terminal and a second output terminal, and the output sub-circuit is configured to transmit a signal input through the third control terminal to the second output terminal under the control of a potential of the first pull-up node, and the output sub-circuit is configured to transmit a signal input through the first control terminal to the first output terminal under the control of a potential of the second pull-up node;
   the pull-down node control sub-circuit is connected to the first pull-up node, the pull-down node, a first voltage terminal and a second control terminal and the pull-down node control sub-circuit is not connected to the second pull-up node, where the pull-down node control sub-circuit is configured to transmit a signal input from the second control terminal to the pull-down node under the control of the signal input from the second control terminal, and is configured to transmit a signal input from the first voltage terminal to the pull-down node under the control of the potential of the first pull-up node; and
   the first control terminal and the third control terminal are configured to simultaneously input a signal to the output sub-circuit, and an effective voltage of the signal input from the first control terminal is greater than an effective voltage of the signal input from the third control terminal, so that the pull-down node control sub-circuit is turned on under the control of a lower voltage while the first output terminal of the output terminal circuit outputs a higher voltage.

2. The gate driving unit circuit according to claim 1, further comprising a pull-up node control sub-circuit, wherein the pull-up node control sub-circuit is connected to the first pull-up node, the second pull-up node, the pull-down node, and the first voltage terminal, and the pull-up node control sub-circuit is configured to transmit the signal input from the first voltage terminal to the first pull-up node and the second pull-up node under the control of a potential of the pull-down node.

3. The gate driving unit circuit according to claim 2, wherein:
   the pull-up node control sub-circuit comprises a first pull-up node control sub-circuit and a second pull-up node control sub-circuit;
   the first pull-up node control sub-circuit is configured to transmit the signal input from the first voltage terminal to the first pull-up node under the control of the potential of the pull-down node; and
   the second pull-up node control sub-circuit is configured to transmit the signal input from the first voltage terminal to the second pull-up node under the control of the potential of the pull-down node.

4. The gate driving unit circuit according to claim 3, wherein:
   the first pull-up node control sub-circuit comprises a tenth transistor, and the second pull-up node control sub-circuit comprises a twelfth transistor; and
   a gate of the tenth transistor and a gate of the twelfth transistor are commonly connected to the pull-down node, a first electrode of the tenth transistor and a first electrode of the twelfth transistor are commonly connected to the first voltage terminal, a second electrode of the tenth transistor is connected to the first pull-up node, and a second electrode of the twelfth transistor is connected to the second pull-up node.

5. The gate driving unit circuit according to claim 1, further comprising a pull-down sub-circuit, wherein the pull-down sub-circuit is connected to the pull-down node, the first output terminal, the second output terminal, and the first voltage terminal, and the pull-down sub-circuit is configured to transmit the signal input from the first voltage terminal to the first output terminal and the second output terminal under the control of the pull-down node.

6. The gate driving unit circuit according to claim 5, wherein:
   the pull-down sub-circuit comprises a first pull-down sub-circuit and a second pull-down sub-circuit;
   the first pull-down sub-circuit is configured to transmit the signal input from the first voltage terminal to the second output terminal under the control of the potential of the pull-down node; and
   the second pull-down sub-circuit is configured to transmit the signal input from the first voltage terminal to the first output terminal under the control of the potential of the pull-down node.

7. The gate driving unit circuit according to claim 6, wherein:
   the first pull-down sub-circuit comprises an eleventh transistor, and the second pull-down sub-circuit comprises a sixteenth transistor; and
   a gate of the eleventh transistor and a gate of the sixteenth transistor are commonly connected to the pull-down node, a first electrode of the eleventh transistor and a first electrode of the sixteenth transistor are commonly connected to the first voltage terminal, a second electrode of the eleventh transistor is connected to the second output terminal, and a second electrode of the sixteenth transistor is connected to the first output terminal.

8. The gate driving unit circuit according to claim 1, further comprising a reset sub-circuit, wherein the reset sub-circuit is connected to a reset control terminal, the first pull-up node, the second pull-up node, the first output terminal, the second output terminal and the first voltage terminal, and the reset sub-circuit is configured to transmit the signal input from the first voltage terminal to the first pull-up node, the second pull-up node, the first output terminal and the second output terminal under the control of a signal input from the reset control terminal.

9. The gate driving unit circuit according to claim 8, wherein:
the reset sub-circuit comprises a first reset sub-circuit and a second reset sub-circuit;
the first reset sub-circuit is configured to transmit the signal input from the first voltage terminal to the first pull-up node and the second output terminal under the control of the signal input from the reset control terminal; and
the second reset sub-circuit is configured to transmit the signal input from the first voltage terminal to the second pull-up node and the first output terminal under the control of the signal input from the reset control terminal.

10. The gate driving unit circuit according to claim 9, wherein:
the first reset sub-circuit comprises a second transistor and a fourth transistor, and the second reset sub-circuit comprises a thirteenth transistor and a seventeenth transistor;
a gate of the second transistor, a gate of the fourth transistor, a gate of the thirteenth transistor, and a gate of the seventeenth transistor are commonly connected to the reset control terminal;
a first electrode of the second transistor, a first electrode of the fourth transistor, a first electrode of the thirteenth transistor and a first electrode of the seventeenth transistor are commonly connected to the first voltage terminal; and
a second electrode of the second transistor is connected to the first pull-up node, a second electrode of the fourth transistor is connected to the second output terminal, a second electrode of the thirteenth transistor is connected to the second pull-up node, and a second electrode of the seventeenth transistor is connected to the first output terminal.

11. The gate driving unit circuit according to claim 1, wherein:
the input sub-circuit comprises a first input sub-circuit and a second input sub-circuit;
the output sub-circuit comprises a first output sub-circuit and a second output sub-circuit;
the first input sub-circuit is connected to the first output sub-circuit via the first pull-up node, and the second input sub-circuit is connected to the second output sub-circuit via the second pull-up node; and
the first output sub-circuit is configured to transmit a signal input from the third control terminal to the second output terminal under the control of the potential of the first pull-up node, and the second output sub-circuit is configured to transmit a signal input from the first control terminal to the first output terminal under the control of the potential of the second pull-up node.

12. The gate driving unit circuit according to claim 11, wherein:
the first input sub-circuit comprises a first transistor, the second input sub-circuit comprises a fourteenth transistor, the first output sub-circuit comprises a fifteenth transistor and a first capacitor, and the second output sub-circuit comprises a third transistor and a second capacitor;
a gate and a first electrode of the first transistor are connected to the input terminal, and a second electrode of the first transistor is connected to the first pull-up node;
a gate and a first electrode of the fourteenth transistor are connected to the input terminal, and a second electrode of the fourteenth transistor is connected to the second pull-up node;
a gate of the fifteenth transistor is connected to the first pull-up node, and a first electrode of the fifteenth transistor is connected to the third control terminal;
a first electrode of the first capacitor is connected to the first pull-up node, and a second electrode of the fifteenth transistor and a second electrode of the first capacitor are commonly connected to the second output terminal; and
a gate of the third transistor is connected to the second pull-up node, a first electrode of the third transistor is connected to the first control terminal, a first electrode of the second capacitor is connected to the second pull-up node, and a second electrode of the third transistor and a second electrode of the second capacitor are commonly connected to the first output terminal.

13. The gate driving unit circuit according to claim 1, wherein:
the pull-down node control sub-circuit comprises a ninth transistor, a fifth transistor, an eighth transistor, and a sixth transistor;
a gate and a first electrode of the ninth transistor are connected to the second control terminal, and a second electrode of the ninth transistor is connected to a gate of the fifth transistor;
a first electrode of the fifth transistor is connected to the second control terminal, and a second electrode of the fifth transistor is connected to the pull-down node; and
a gate of the eighth transistor and a gate of the sixth transistor are commonly connected to the first pull-up node, a first electrode of the eighth transistor and a first electrode of the sixth transistor are commonly connected to the first voltage terminal, a second electrode of the eighth transistor is connected to the gate of the fifth transistor, and a second electrode of the sixth transistor is connected to the pull-down node.

14. The gate driving unit circuit according to claim 1, wherein:
a second output terminal of the gate drive unit circuit of a previous stage is connected to an input terminal of the gate drive unit circuit of a next stage.

15. The gate driving unit circuit according to claim 14, wherein:
each of the gate driving unit circuits comprises a reset sub-circuit; and
the first output terminal of the gate drive unit circuit of the next stage is connected to the reset control terminal of the gate drive unit circuit of the previous stage.

16. A gate driving unit circuit, being the gate driving unit circuit at a stage of a gate driving circuit comprising a plurality of cascaded gate driving unit circuits, and comprising:
- a first transistor, having a gate and a first electrode connected to an input terminal, and a second electrode connected to a first pull-up node;
- a fourteenth transistor, having a gate and a first electrode connected to the input terminal, and a second electrode connected to a second pull-up node;
- a first capacitor, having a first electrode connected to the first pull-up node, and a second electrode connected to a second output terminal;
- a fifteenth transistor, having a gate connected to the first pull-up node, a first electrode connected to a third control terminal, and a second electrode connected to the second output terminal;
- a second capacitor, having first electrode connected to the second pull-up node, and a second electrode connected to a first output terminal;
- a third transistor, having a gate connected to the second pull-up node, a first electrode connected to a first control terminal, and a second electrode connected to the first output terminal;
- a tenth transistor, having a gate connected to a pull-down node, a first electrode connected to a first voltage terminal, and a second electrode connected to the first pull-up node;
- a twelfth transistor, having a gate connected to the pull-down node, a first electrode connected to the first voltage terminal, and a second electrode connected to the second pull-up node;
- an eleventh transistor, having a gate connected to the pull-down node, a first electrode connected to the first voltage terminal, and a second electrode connected to the second output terminal;
- a sixteenth transistor, having a gate connected to the pull-down node, a first electrode connected to the first voltage terminal, and a second electrode connected to the first output terminal;
- a second transistor, having a gate connected to a reset control terminal, a first electrode connected to the first voltage terminal, and a second electrode connected to the first pull-up node;
- a fourth transistor, having a gate connected to the reset control terminal, a first electrode connected to the first voltage terminal, and a second electrode connected to the second output terminal;
- a thirteenth transistor, having a gate connected to the reset control terminal, a first electrode connected to the first voltage terminal, and a second electrode connected to the second pull-up node;
- a seventeenth transistor, having a gate connected to the reset control terminal, a first electrode connected to the first voltage terminal, and a second electrode connected to the first output terminal;
- a fifth transistor, having a first electrode connected to the second control terminal, and a second electrode connected to the pull-down node, and being not connected to the second pull-up node;
- a ninth transistor, having a gate and a first electrode connected to the second control terminal, and a second electrode connected to a gate of the fifth transistor, and being not connected to the second pull-up node;
- an eighth transistor, having a gate connected to the first pull-up node, a first electrode connected to the first voltage terminal, and a second electrode connected to the gate of the fifth transistor, and being not connected to the second pull-up node; and
- a sixth transistor, having a gate connected to the first pull-up node, a first electrode connected to the first voltage terminal, and a second electrode connected to the pull-down node, and being not connected to the second pull-up node; wherein the first control terminal and the third control terminal are configured to simultaneously input a signal to the fifteenth transistor and the third transistor, respectively, and an effective voltage of the signal input from the first control terminal to the third transistor is greater than an effective voltage of the signal input from the third control terminal to the fifteenth transistor, so that the fifth transistor, the ninth transistor, the eighth transistor, and the sixth transistor are turned on under the control of a lower voltage while the first output terminal outputs a higher voltage.

17. A method for driving a gate driving unit circuit, comprising:
- providing the gate driving unit circuit, the gate driving unit circuit being the gate driving unit circuit at a stage of a gate driving circuit comprising a plurality of cascaded gate driving unit circuits, and comprising an input sub-circuit, an output sub-circuit, and a pull-down node control sub-circuit, wherein:
    - the input sub-circuit is connected to a first pull-up node, a second pull-up node and an input terminal, and the input sub-circuit is configured to transmit a signal input from the input terminal to the first pull-up node and the second pull-up node;
    - the output sub-circuit is connected to the first pull-up node, the second pull-up node, a first control terminal, a third control terminal, a first output terminal and a second output terminal, and the output sub-circuit is configured to transmit a signal input through the third control terminal to the second output terminal under the control of a potential of the first pull-up node, and the output sub-circuit is configured to transmit a signal input through the first control terminal to the first output terminal under the control of a potential of the second pull-up node;
    - the pull-down node control sub-circuit is connected to the first pull-up node, the pull-down node, a first voltage terminal and a second control terminal and the pull-down node control sub-circuit is not connected to the second pull-up node, where the pull-down node control sub-circuit is configured to transmit a signal input from the second control terminal to the pull-down node under the control of the signal input from the second control terminal, and is configured to transmit a signal input from the first voltage terminal to the pull-down node under the control of the potential of the first pull-up node; and
    - the first control terminal and the third control terminal are configured to simultaneously input a signal to the output sub-circuit, and an effective voltage of the signal input from the first control terminal is greater than an effective voltage of the signal input from the third control terminal, so that the pull-down node control sub-circuit is turned on under the control of a lower voltage while the first output terminal of the output terminal circuit outputs a higher voltage, wherein:
- the method comprises an input phase, an output phase, a reset phase, and a pull-down hold phase; and in the input phase, a signal applied to the input terminal causes the input sub-circuit to transmit the signal input from the input terminal to the first pull-up node and the second pull-up node.

18. The method according to claim 17, wherein, in the output stage, a signal applied to the first control terminal causes the output sub-circuit to transmit the signal input from the first control terminal to the first output terminal, and a signal applied to the third control terminal causes the output sub-circuit to transmit the signal input from the third control terminal to the second output terminal.

19. The method according to claim 18, wherein, in the output stage, a voltage of the first pull-up node is the sum of the signal applied to the input terminal in the input stage and the signal applied to the third control terminal in the output stage, and a voltage of the second pull-up node is the sum of the signal applied to the input terminal in the input phase and the signal applied to the first control terminal in the output phase.

20. The method according to claim 17, wherein the signal input from the first control terminal and the signal input from the third control terminal have same period and phase, and the effective voltage of the signal input from the first control terminal is twice the effective voltage of the signal input from the third control terminal.

* * * * *